United States Patent
Shimogaichi et al.

[11] Patent Number: 6,020,224
[45] Date of Patent: Feb. 1, 2000

[54] METHOD FOR MAKING THIN FILM TRANSISTOR

[75] Inventors: Yasushi Shimogaichi; Hisao Hayashi, both of Kanagawa, Japan

[73] Assignee: Sony Corporation, Tokyo, Japan

[21] Appl. No.: 09/100,403

[22] Filed: Jun. 19, 1998

[30] Foreign Application Priority Data

Jun. 19, 1997 [JP] Japan ................................ P09-172993

[51] Int. Cl.[7] ............................ H01L 21/00; H01L 21/20
[52] U.S. Cl. ........................ 438/158; 438/159; 438/486; 438/487
[58] Field of Search ................................ 438/158, 159, 438/486, 487

[56] References Cited

U.S. PATENT DOCUMENTS

| | | | |
|---|---|---|---|
| 5,183,780 | 2/1993 | Noguchi et al. | 437/173 |
| 5,366,926 | 11/1994 | Mei et al. | 437/173 |
| 5,478,766 | 12/1995 | Park et al. | 437/40 |
| 5,529,951 | 6/1996 | Noguchi et al. | 437/174 |
| 5,834,071 | 11/1998 | Lin | 427/578 |
| 5,920,772 | 7/1999 | Lin | 438/158 |
| 5,943,593 | 8/1999 | Noguchi et al. | 438/487 |
| 5,946,562 | 8/1999 | Kuo | 438/166 |

*Primary Examiner*—John F. Niebling
*Assistant Examiner*—Michael S Lebentritt
*Attorney, Agent, or Firm*—Hill & Simpson

[57] ABSTRACT

In production of a thin film transistor, a gate electrode is formed on an insulating substrate. A gate nitride film and a gate oxide film are formed on the gate electrode. A semiconductor thin film is formed on the gate oxide film. The semiconductor thin film is irradiated with laser light for crystallization. The growth of the crystal grains in a first section of the semiconductor thin film lying just above the gate electrode is more significant than that of the crystal grains in a second section of the semiconductor thin film lying in a position other than just above the gate electrode. An impurity is selectively doped into the second section of the semiconductor thin film to form a source region and a drain region, while the first section of the semiconductor thin film is left without modification as a channel-forming region.

16 Claims, 6 Drawing Sheets

METHOD FOR MAKING THIN FILM TRANSISTOR

BACKGROUND OF THE INVENTION

1. Field of the Invention

The present invention relates to methods for making bottom-gate-type thin film transistors having active layers composed of polycrystalline silicon and the like. More particularly, the present invention relates to a technology for crystallization of a bottom-gate-type thin film transistor made by a low temperature process of 600° C. or less.

2. Description of the Related Art

Thin film transistors suitable for switching elements in active matrix liquid crystal displays are being intensively developed. Polycrystalline or amorphous silicon is used as the active layer in thin film transistors. In particular, polycrystalline silicon thin film transistors have attracted attention because they enable the achievement of compact, high-definition, active matrix, color liquid crystal displays. The use of polycrystalline silicon having higher carrier mobility than that of amorphous silicon enhances current-driving characteristics of a thin film transistor; hence, a peripheral circuit section requiring high-speed driving can be formed together with thin film transistors for pixel switching on the same substrate.

In device and process technologies for thin film transistors, high temperature processes with process temperatures of higher than 1,000° C. have been established. A high temperature process is characterized by modification of a semiconductor thin film formed on a highly heat-resistant substrate such as quartz by means of solid-phase deposition. In the solid-phase deposition, the semiconductor thin film is annealed at a temperature of higher than 1,000° C. to grow individual microcrystal grains in polycrystalline silicon. The polycrystalline silicon formed by the solid-phase deposition has a high carrier mobility of approximately 100 $cm^2/V$-s. Since such a high temperature process essentially requires the use of a highly heat-resistant substrate, expensive quartz has been used. Quartz, however, has a disadvantage since it contributes to increased production costs.

Low temperature processes at temperatures of less than 600° C. have been developed as a substitute for the high temperature process. Laser annealing using laser light has attracted attention as one of the low temperature processes for thin film transistors. In laser annealing, a non-single-crystal semiconductor thin film composed of amorphous or polycrystalline silicon deposited on a low heat-resistant insulating substrate of glass or the like is irradiated with laser light to locally melt the semiconductor thin film and then the semiconductor thin film is crystallized in the cooling step. Polycrystalline silicon thin film transistors are integrally formed by using the crystallized semiconductor thin film as an active layer (a channel region). Since the crystallized semiconductor thin film has a high carrier mobility, the resulting thin film transistors have excellent performance.

In laser annealing, a line-shaped laser beam (hereinafter referred to as a line beam) has been used. Line beams are scanned in a given direction on the semiconductor thin film, while partially overlapping the previously irradiated area. For example, short-duration pulses of line-shaped XeCl excimer laser light with a wavelength of 308 nm are repeatedly radiated. An exemplary line beam is shaped into a line of 300 mm by 0.5 mm, and has an irradiation energy density of 350 $mJ/cm^2$. As an example, the pulse width of the line beam is approximately 40 nsec and the repetition frequency is approximately 150 Hz. The line beam pulses are radiated with an overlap rate of 90% to 99%.

Top-gate configurations are the mainstream of thin film transistors. In a top-gate configuration, a semiconductor thin film is deposited on an insulating substrate and a gate electrode is formed thereon with a gate insulating film formed therebetween. In a low temperature process, an inexpensive large glass substrate is used as the insulating substrate. The glass substrate contains large amounts of impurities such as sodium, which localize in response to a voltage for driving the thin film transistor. The electric field caused by the localization changes thin film transistor characteristics, resulting in deterioration of reliability. Recently, bottom-gate configurations suitable for low temperature processes have been developed as a countermeasure against the above-mentioned problem. In the bottom-gate configuration, a gate electrode of a metal film or the like is provided on an insulating substrate such as a glass plate, and a semiconductor thin film is formed thereon with a gate insulating film formed therebetween. The gate electrode shields the electric field in the glass plate; hence, the bottom-gate configuration is more reliable than the top-gate configuration.

The bottom-gate configuration, however, has a serious problem in crystallization by laser annealing. In the semiconductor thin film to be crystallized, the portion used primarily as a channel region lies just above the gate electrode, and the source and drain regions lie on the glass plate. Consequently, when energy by laser irradiation is applied, there are differences in thermal conduction and heat dissipation between the glass plate and the metal gate electrode. The channel region and the source and drain regions have, therefore, different optimum energies by laser irradiation, and optimum energy laser irradiation for achieving high carrier mobility is not possible. That is, in crystallization by laser annealing, both the semiconductor thin film on the metal gate electrode and the semiconductor thin film on the glass substrate are simultaneously irradiated with laser light. During cooling of the melt, the melt is solidified on the metal gate electrode within a relatively short time since the heat dissipates in the transverse direction through the gate line. Thus, the semiconductor thin film has different crystal grain sizes above the metal gate electrode and the glass substrate, and has nonuniform carrier mobility. In extreme cases, when an attempt is made to increase the crystal grain size of the semiconductor thin film on the metal gate electrode, the semiconductor thin film on the glass plate will vaporize because of the excessive amount of irradiated energy. In contrast, when an attempt is made to maintain the crystals of the semiconductor thin film on the glass plate in a normal state, the crystal grain size of the semiconductor thin film on the metal gate electrode is excessively reduced. Overlapping irradiation using line beams increases the possibility of the formation of fine holes by evaporation in the semiconductor thin film because of excessive laser irradiation energy. Line beam irradiation has a small range of allowable laser energy and it is difficult to determine the irradiation conditions.

SUMMARY OF THE INVENTION

It is an object of the present invention to provide a method for making a high performance thin film transistor with high mobility.

It is another object of the present invention to provide a method for making a bottom-gate-type thin film transistor by a low temperature process of 600 ° C. or less.

A first aspect in accordance with the present invention is a method for making a thin film transistor which includes forming a gate electrode on an insulating substrate, forming a gate insulating film on the gate electrode, and depositing a semiconductor thin film on the gate insulating film. Crystallizing the semiconductor thin film by laser light irradiation causes more significant growth in the crystal grains in a first section of the semiconductor thin film lying just above the gate electrode than that of the crystal grains in a second section of the semiconductor thin film lying at a position other than just above the gate electrode. The method also includes selectively doping an impurity into the second section of the semiconductor thin film to form a source region and a drain region while leaving the first section of the semiconductor thin film as a channel-forming region.

Preferably, the first section of the semiconductor thin film is changed into a polycrystalline state having a crystal grain size ranging from 100 nm to 500 nm while the second section of the semiconductor thin film is changed into a microcrystal or amorphous state having a crystal grain size of 10 nm or less.

Preferably, in the crystallization, the semiconductor thin film is irradiated with laser light having a wavelength of 400 nm or less and a pulse width of 10 ns or more.

Preferably, in the crystallization, the semiconductor thin film is irradiated with a laser light pulse with a rectangular irradiation area having a side of 1 cm or more so as to perform crystallization.

Preferably, in the crystallization, the semiconductor thin film is irradiated with laser light having an energy density ranging from 500 mJ/cm$^2$ to 700 mJ/cm$^2$.

Preferably, the method further includes an impurity-activation step for activating the impurity doped into the source region and the drain region after the impurity-doping.

Preferably, the impurity-activation step is performed by reirradiating the semiconductor thin film with laser light under conditions not substantially affecting the crystalline state of the channel-forming region.

Preferably, the impurity-activation step is performed by rapid thermal annealing.

Preferably, in the deposition, the semiconductor thin film composed of amorphous silicon having a thickness of 50 nm or less is formed by a chemical vapor deposition process, and then heated so as to reduce the hydrogen content in the amorphous silicon to 5% or less.

In accordance with the present invention, a second method for making a display device includes the steps of integrally forming pixel electrodes and thin film transistors for driving the pixel electrodes on an insulating substrate, forming counter electrodes on another insulating substrate, and joining the two insulating substrates with a given space therebetween such that an electro-optical material is held in the space. Each of the thin film transistors is formed by the following steps: forming a gate electrode on an insulating substrate; forming a gate insulating film on the gate electrode; and depositing a semiconductor thin film on the gate insulating film. Subsequently, crystallizing the semiconductor thin film by laser light irradiation causes more significant growth in the crystal grains in a first section of the semiconductor thin film lying just above the gate electrode than that of the crystal grains in a second section of the semiconductor thin film lying in a position other than just above the gate electrode. The second method also include and selectively doping an impurity into the second section of the semiconductor thin film to form a source region and a drain region while leaving the first section of the semiconductor thin film as a channel-forming region.

Preferably, after doping, the semiconductor thin film is reirradiated with laser light to activate and crystallize the source region and the drain region under conditions not substantially affecting the crystal state of the channel-forming region.

Preferably, in the deposition, the semiconductor thin film composed of amorphous silicon having a thickness of 50 nm or less is formed by a chemical vapor deposition process, and then heated so as to reduce the hydrogen content in the amorphous silicon to 5% or less.

DESCRIPTION OF THE PREFERRED EMBODIMENT

Figure 1A:
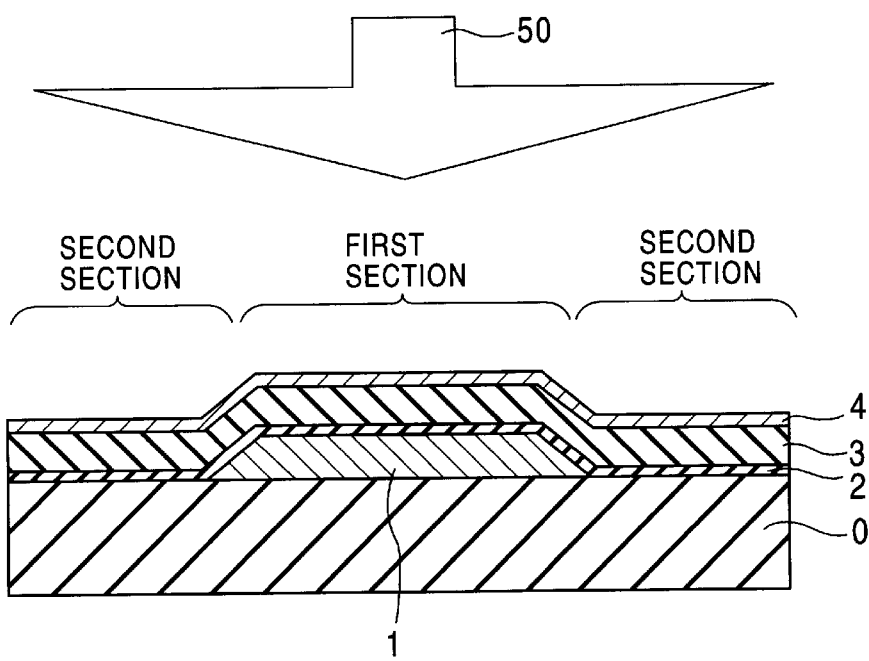
FIG. 1A is a schematic view illustrating a method for making a thin film transistor in accordance with the present invention.

The embodiments in accordance with the present invention will now be described in detail with reference to the drawings. FIG. 1A schematically illustrates a method for making a thin film transistor in accordance with the present invention. First, a gate electrode 1 composed of a metal film is formed on an insulating substrate 0 composed of glass or the like. A gate insulating film is formed on the gate electrode 1. In this embodiment, a composite insulating film composed of a gate nitride film 2 and a gate oxide film 3 is formed on the gate electrode 1. Next, a semiconductor thin film 4 is formed on the gate oxide film 3 by a deposition step. The semiconductor thin film 4 is irradiated with laser light 50 to perform a crystallization step. The crystal grains in a first section of the semiconductor thin film 4 lying just above the gate electrode 1 grow more significantly than the crystal grains in a second section of the semiconductor thin film 4 lying in a position other than just above the gate electrode 1. Finally, impurities are selectively doped into the second section of the semiconductor thin film 4 to form a source region and a drain region, while the first section of the semiconductor thin film 4 is left as a channel region.

Preferably, by laser light irradiation in the crystallization step, the first section of the semiconductor thin film 4 is changed into a polycrystalline state having a crystal grain size ranging from 100 nm to 500 nm while the second section of the semiconductor thin film is changed into a microcrystal or amorphous state having a crystal grain size of 10 nm or less. Preferably, in the crystallization step, the semiconductor thin film 4 is irradiated with laser light having a wavelength of 400 nm or less and a pulse width of 10 ns or more. Preferably, in the crystallization step, the semiconductor thin film 4 is irradiated with a laser light pulse of a rectangular irradiation area having a side of 1 cm or more so as to perform crystallization. Preferably, in the crystallization step, the semiconductor thin film 4 is irradiated with laser light having an energy density ranging from 500 mJ/cm$^2$ to 700 mJ/cm$^2$. Preferably, after the doping step, the semiconductor thin film 4 is reirradiated with laser light to activate and crystallize the source region and the drain region in order to impart resistance to the source region and the drain region, under conditions not substantially affecting the crystal state of the channel region. Preferably, in the deposition step, the semiconductor thin film 4 composed of amorphous silicon having a thickness of 50 nm or less is formed by a chemical vapor deposition process (CVD), and then heated so as to reduce the hydrogen content in the amorphous silicon to 5% or less.

Figure 1B:
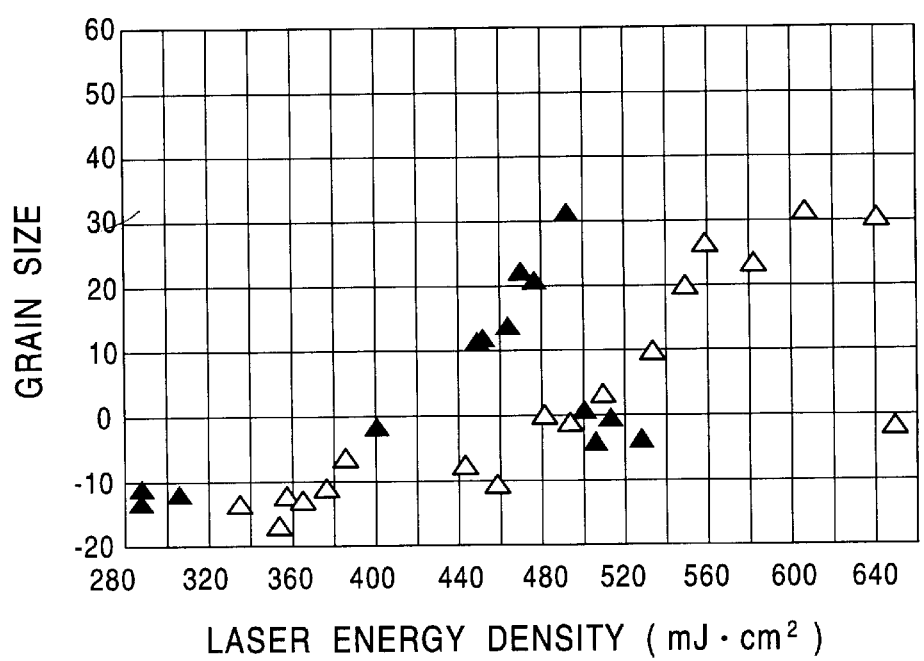
FIG. 1B is a graph illustrating the relationship between the laser energy density and the grain size.

FIG. 1B is a graph illustrating the relationship between the laser energy and the crystal grain size. The symbol Δ indicates the grain size in the first section of the semiconductor thin film lying just above the gate electrode, and the symbol ▲ indicates the grain size in the second section of the semiconductor thin film lying on the insulating substrate. These grain sizes are represented by a relative scale. As shown in the graph of FIG. 1B, the first section on the gate electrode and the second section on the insulating substrate have different optimum energies of laser light for crystallization. When laser light with an energy density range of 500 mJ/cm$^2$ to 700 mJ/cm$^2$ is radiated, the first section has a large grain size. Since the first section is used as the channel region, an increased grain size in the first section directly causes improved performance of the thin film transistor. The grain size reaches 100 nm to 500 nm. On the other hand, the grain size in the second section of the semiconductor thin film on the insulating substrate is small for the laser energy density range of 500 mJ/cm$^2$ to 700 mJ/cm$^2$, and the second section is in a micrycrystallite or amorphous state. Since the second section is used as a source region and a drain region, it must have sufficiently low resistance; however, it is not necessary to increase the grain size. The second section can be changed to low resistance in the succeeding step.

Figure 2:
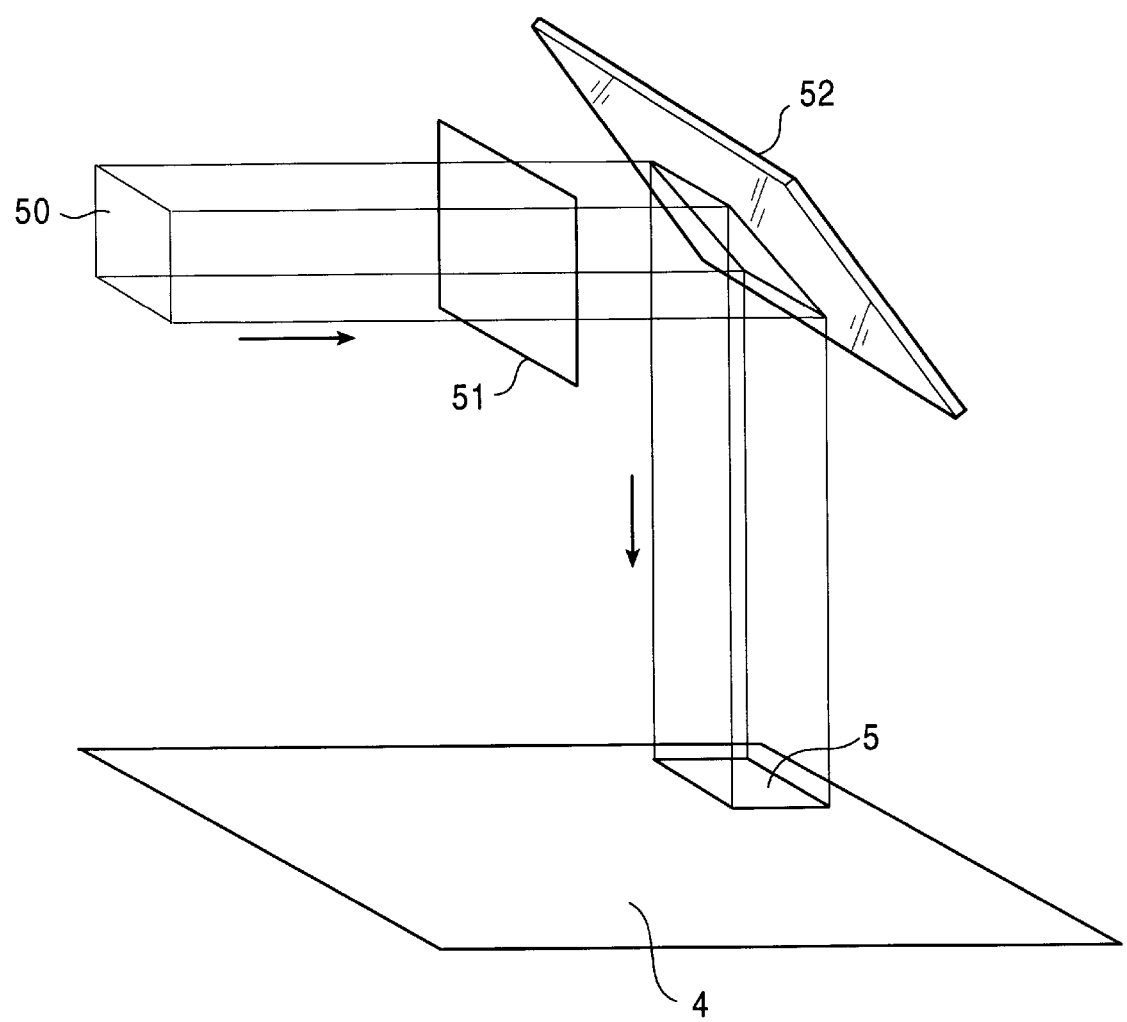
FIG. 2 is a schematic view illustrating a laser irradiation apparatus used in the method in accordance with the present invention.

FIG. 2 is a schematic view of a laser radiation apparatus used in the crystallization step. As shown in the drawing, rectangular laser light 50 (hereinafter referred to as a rectangular laser beam) is radiated as pulses to convert the amorphous semiconductor thin film 4 into a polycrystalline semiconductor thin film 5. The laser light 50 has a wavelength of less than 400 nm. For example, when a XeCl excimer laser is used as a laser source, the laser light 50 has a wavelength of 308 nm. The excimer laser is of a pulse oscillation type and has a relatively high output power. The laser light 50 emerging from the laser source is shaped by a beam homogenizer 51 and introduced onto the insulating substrate via an optical system including a mirror 52. The insulating substrate can be moved stepwise in relation to the laser light 50, although it is not shown in the drawing.

Figure 3:
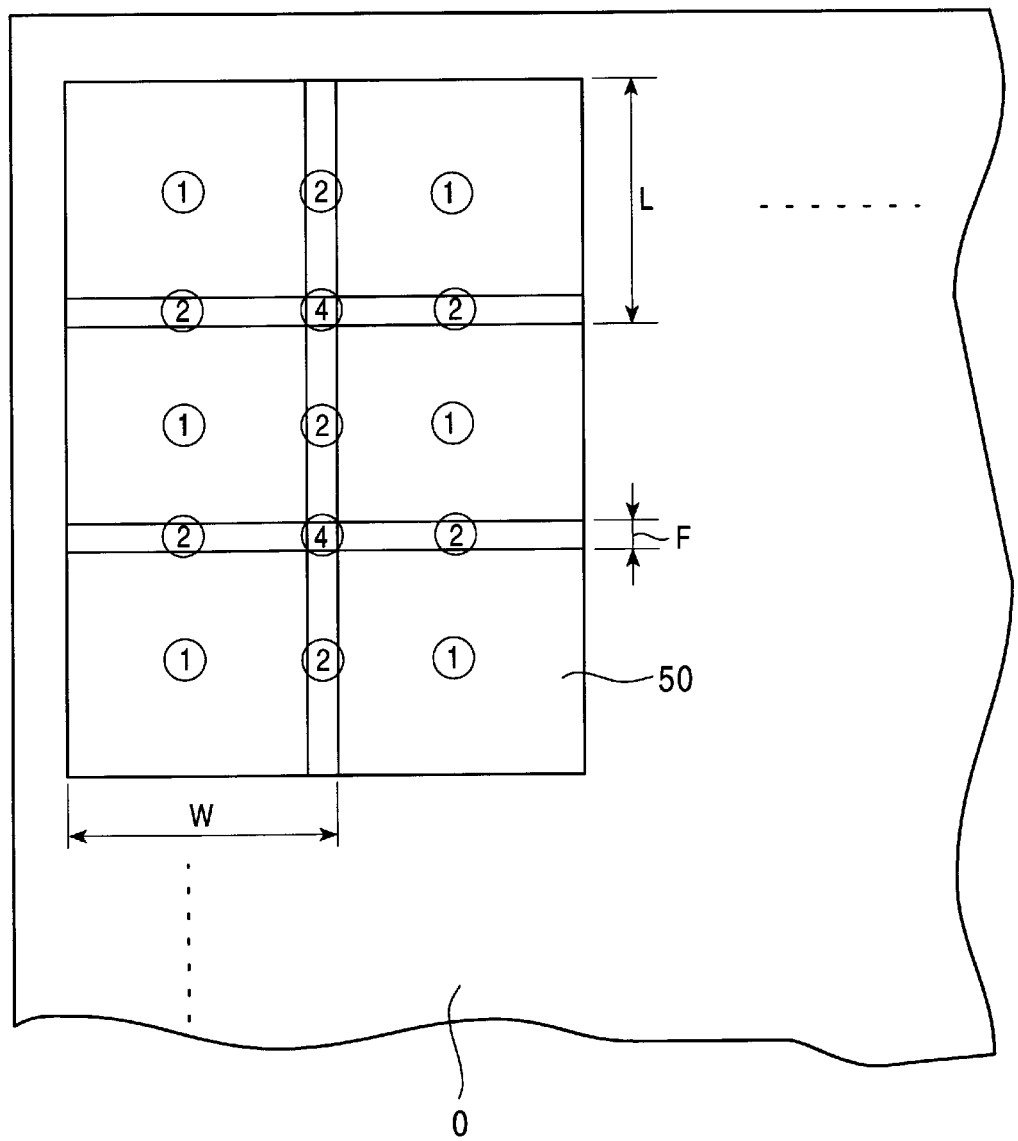
FIG. 3 is a schematic view illustrating a method for laser irradiation.

FIG. 3 is a schematic view illustrating a method of irradiation with rectangular beams. As shown in the drawing, the laser light 50 is shaped into a rectangle with a width W and a length L. The rectangular beams are radiated as pulses. For example, the pulse duration time is set at 100 nsec or more (preferably, 150 to 250 nsec), the energy density is set at 500 to 700 mJ/cm$^2$, and the oscillation frequency is set at 1 Hz or more. Next, the insulating substrate 0 is scanned in the two orthogonal directions while being irradiated with the rectangular beams 50 stepwise. The width W and the length L of the rectangular beams 50 are set at 1 cm or more. The radiation regions of two adjacent rectangular beams 50 partly overlap with each other. The size of the overlapped sections is represented by symbol F. In the step scanning, the central sections of the rectangular beam correspond to one shot, the side sections correspond to two shots, and the corner sections correspond to four shots. In this embodiment, the width W is set to 50 mm, the length L is set to 60 mm, and the size F is set to 5 mm, in step radiation of the rectangular beams 50. Irradiation of the entire insulating substrate 0 with a size of 600 mm by 550 mm requires approximately 100 sec.

Figure 4:
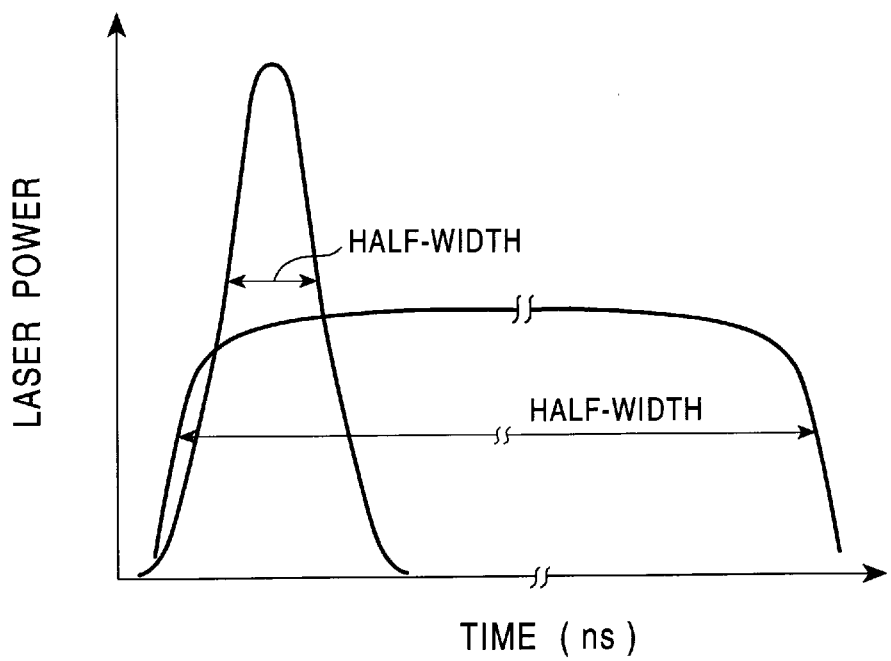
FIG. 4 is a graph with curves showing laser power versus the irradiation time of the laser light.

In the crystallization of amorphous silicon, the pulse width (the pulse duration time) significantly affects the crystal grain size. FIG. 4 illustrates curves showing the relationship between energy and the pulse duration time of laser light. Here, the half-width of the laser light pulse is defined as the pulse width. Crystallization has been performed using a line beam with a small half-width. The line beam has a half-width of 20 nsec to 40 nsec. In contrast, crystallization in the present invention is performed using a rectangular beam with a half-width of 100 nsec or more. Experiments were carried out for confirming the effect of the pulse duration time. In order to hold the thermal energy given to a semiconductor thin film constant, the peak power of the laser light was determined such that the total energy represented by the accumulated value of the energy under the curves shown in FIG. 4 became constant. Under such a condition, amorphous silicon was subjected to crystallization for various pulse duration times, and the grain sizes of the resulting polycrystalline silicon were determined. As the pulse duration time is shortened to 20 nsec to 40 nsec, the grain size in one shot decreases to several tens of nanometers, and microcrystals form. A short pulse duration time reduces the time from the melting of the amorphous silicon by laser energy to the solidification of the polycrystalline silicon, hence the density of nucleation increases, resulting in a decreased grain size. On the other hand, a pulse duration time of longer than 100 nsec prolongs the time from the melting to the solidification and thus the time for crystal growth, hence the density of nucleation decreases, resulting in an increased grain size.

Figure 5:
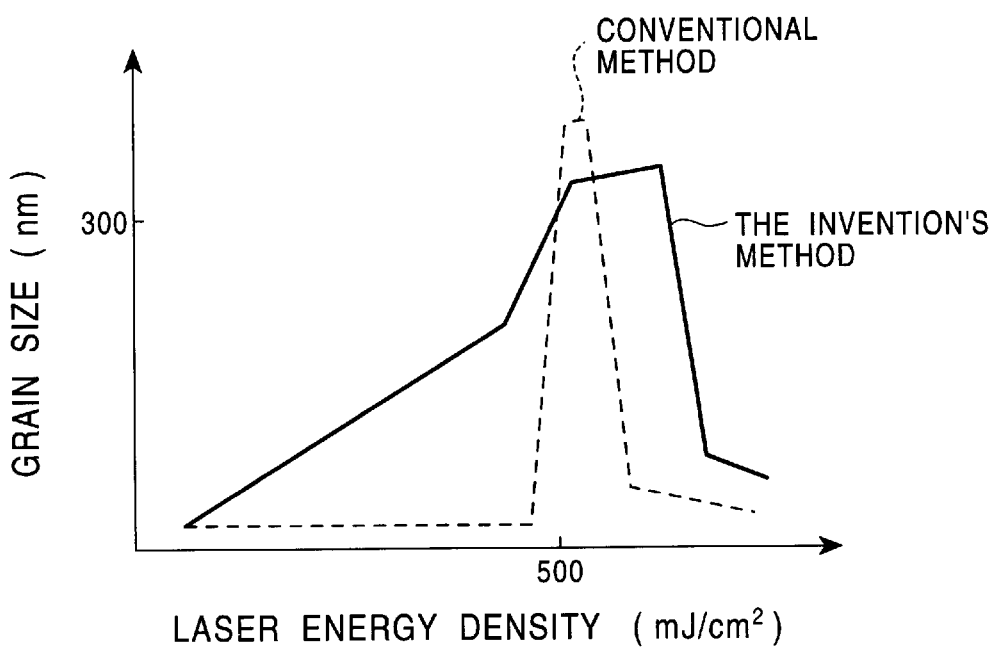
FIG. 5 is a graph illustrating the relationship between the laser energy and the grain size.

FIG. 5 illustrates the relationship between the laser energy density and the grain size. The solid line shows crystallization using a rectangular laser beam in accordance with the present invention, whereas the broken line shows the relationship using a conventional line beam. The graph clearly demonstrates that the use of the conventional line beam causes a significantly narrow energy density width for achieving polycrystalline silicon having a large grain size (approximately 300 nm). In contrast, crystallization using the rectangular beam in accordance with the present invention forms polycrystalline silicon having a grain size of 300 nm or more over a relatively wide energy density range. Even at relatively low irradiation energy density, the change in grain size to the irradiation energy density in the present invention is moderate compared with the conventional method, hence the grain size can be uniformly controlled regardless of periodic and spatial changes in beam energy. According to the experimental results, a grain size of 100 nm to 500 nm is achieved by crystallization using a rectangular beam with a pulse width of 100 nsec or more while controlling the energy density range to be 500 to 700 mJ/cm$^2$.

A method for making the thin film transistor in accordance with the present invention will now be described in detail with reference to FIG. 6. Although this embodiment illustrates a method for making an n-channel-type thin film transistor, a p-channel-type transistor can also be formed similarly by changing the impurity species (dopant species).

Figure 6A:
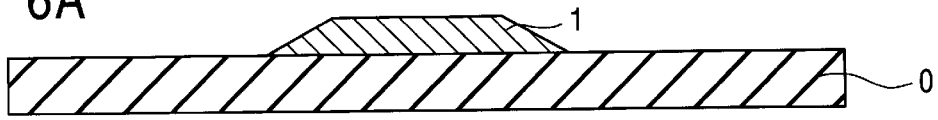
FIG. 6A–6D shows steps for illustrating a method for making a thin film transistor in accordance with the present invention.

As shown in FIG. 6(a), a metal film of Al, Mo, Ta, Ti, Cr, or W, a layered film of a highly doped polycrystalline silicon layer and the metal layer, a layered film of two metal layers, or an alloy film is formed on an insulating substrate 0 composed of glass or the like, and is patterned to form a gate electrode 1 having a predetermined shape.

Figure 6B:
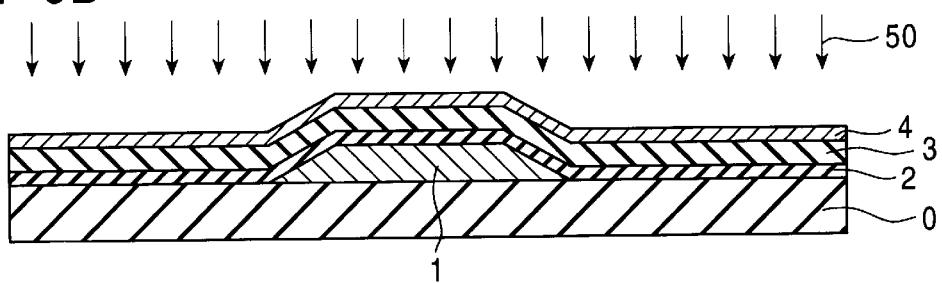

Next, as shown in FIG. 6(b), a gate insulating film is formed on the gate electrode 1. In this embodiment, the gate insulating film has a double-layered configuration including a gate nitride film 2 ($SiN_x$) and a gate oxide film 3 ($SiO_2$). The gate nitride film 2 was deposited by a plasma CVD (PCVD) process using a material gas mixture composed of $SiH_4$ and $NH_3$. In the plasma induction, the radio frequency (RF), the power dneity, and the substrate temperature were set to 13.56 MHz, 0.06W/cm$^2$, and 300° C. to 350° C., respectively, and the deposited film had a thickness of 50 to 150 nm. In the formation of the gate oxide film 3, an organic silane gas, TEOS ($Si(C_2H_5)_4O_4$), was used as a material gas, and the film with a thickness of 50 to 100 nm was deposited at an RF of 10 to 30 MHz, a power density of 0.5 W/cm$^2$, and a substrate temperature of 300 to 450° C. Next, a semiconductor thin film 4 composed of amorphous silicon with a thickness of 30 to 50 nm was formed on the gate oxide film 3. A thickness of more than 50 nm may cause a wide distribution of the crystal grain size in the depth direction in the next crystallization step by laser annealing. The double-layered gate insulating film and the amorphous semiconductor thin film 4 are continuously deposited without breaking the vacuum system of the deposition chamber.

Hydrogen included in the amorphous semiconductor thin film 4 is released by a heating treatment in a nitrogen atmosphere at 400° C. for 2 hours. The treatment is referred to as dehydration annealing. The hydrogen content in the amorphous semiconductor thin film 4 is thereby reduced to 5% or less. A higher hydrogen content may cause bubbling of hydrogen in the next laser-annealing step. The amorphous semiconductor thin film 4 is irradiated with laser light 50 to be converted to a polycrystalline semiconductor thin film 5 by crystallization. So-called laser annealing is a useful means for forming the polycrystalline semiconductor thin film 5 at a process temperature of 600° C. or less. In the present invention as described above, the section of the amorphous semiconductor thin film 4 lying just above the gate electrode is changed by irradiation of laser light 50 into a polycrystalline state with a crystal grain size of 100 nm to 500 nm, while the section of the semiconductor thin film 4 lying just above the insulating substrate 0 is changed into a microcrystal or amorphous state having a crystal grain size of 10 nm or less. In the laser annealing, the amorphous semiconductor thin film 4 is irradiated with laser light 50 of a wavelength of 400 nm or less and a pulse width of 100 ns or more. It is preferable that the pulse width be 300 ns or less in view of the capacity of the laser light. The amorphous semiconductor thin film 4 is irradiated with a rectangular pulse of laser light 50 with sides of 1 cm or more to crystallize the irradiated region. When the amorphous semiconductor thin film 4 is irradiated with laser light 50 having an energy density ranging from 500 mJ/cm$^2$ to 700 mJ/cm$^2$, it is modified to a polycrystalline semiconductor thin film 5 having a grain size of 100 nm to 500 nm.

Figure 6C:
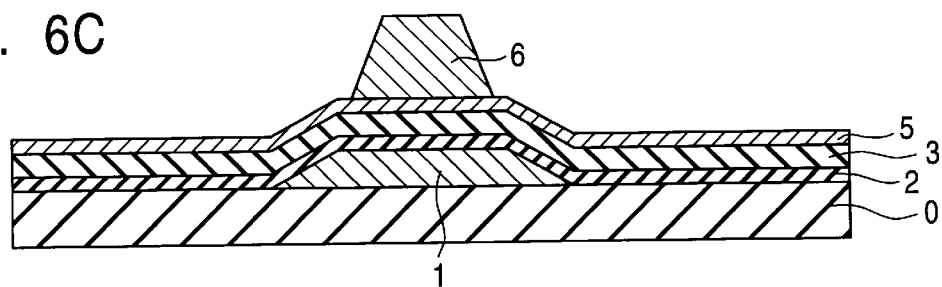

As shown in FIG. 6(C), $SiO_2$ of approximately 200 nm is deposited on the polycrystalline semiconductor thin film 5 by a plasma CVD process using TEOS. $SiO_2$ is patterned to an etching stopper film 6 having a given shape. The patterned etching stopper film 6 is aligned with the gate electrode 1 by a back exposure process. The etching stopper film 6 protects the channel region lying just below thereof in the next etching step of the polycrystalline semiconductor thin film 5.

Figure 6D:
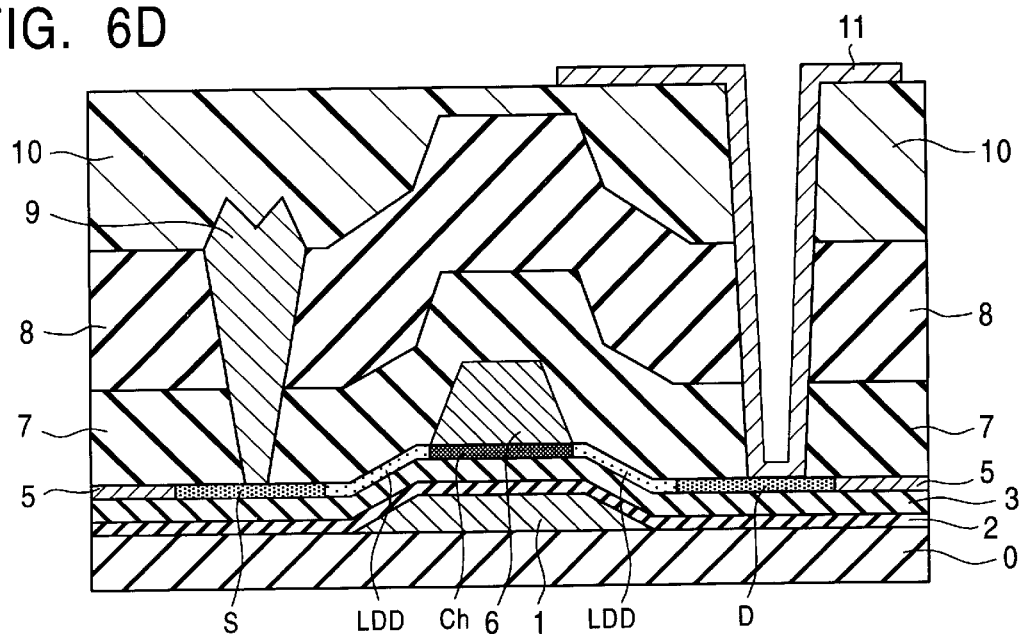

As shown FIG. 6(d), an impurity such as phosphorus is implanted into the semiconductor thin film 5 by ion doping using the etching stopper film 6 as a mask to form an LDD region. A photoresist layer as a mask is formed by patterning so as to cover the stopper film 6 and the LDD region at its two sides, and a high concentration of impurities such as phosphorus is implanted. The implantation may be performed by ion implantation or ion doping. In the former process, impurity ions separated by mass and accelerated in an electric field are implanted into the semiconductor thin film 5. In the latter process, impurity ions accelerated in an electric field are implanted into the semiconductor thin film 5 without mass separation. A source region S and a drain region D are formed by the impurity implantation processes, while the channel region Ch is left just below the mask of the etching stopper film 6. The grain size in the channel region Ch is increased by the laser annealing, as described above. The impurity implanted into the semiconductor thin film 5 is activated by further laser annealing. The semiconductor thin film 5 is reirradiated with laser light under conditions not substantially affecting the crystalline state in the channel region Ch. The source region S and the drain region D are simultaneously activated and crystallized, and thus have low resistance. For example, laser light irradiation with an energy density of 500 mJ/cm$^2$ or less causes coarsening of the grain size in the source region S and the drain region D within a range of no greater than 100 nm, and a decrease in the electrical resistance to near 2 to 10 KΩ. Such activation of the impurity doped into the source region S and the drain region D by laser irradiation slightly prompts the crystal growth in the semiconductor thin film 5 of the microcrystal state. The source electrode and the drain electrode thereby have effective sheet resistance. In this step, the etching stopper film 6 functions as a reflection film for laser light, hence the crystal state in the channel region Ch does not become affected. The grain size determined in the crystallization step is therefore maintained. The impurity-activation step can also be achieved by rapid thermal annealing (RTA) such as lamp annealing in place of the above-mentioned laser irradiation.

At this stage, the semiconductor thin film 5 is patterned into a predetermined shape by etching only. A $SiO_2$ insulating interlayer 7 with a thickness of approximately 200 to 600 nm is deposited. The insulating interlayer 7 is formed by any one of plasma CVD, normal pressure CVD, reduced pressure CVD and sputtering processes. After the formation of the insulating interlayer 7, a $SiN_x$ passivating film (cap film) 8 with a thickness of approximately 100 to 400 nm is deposited by a plasma CVD process. In this step, it is heated at 300 ° C. to 400° C. for 1 to 2 hours in a nitrogen environment, a forming-gas environment or a vacuum environment to diffuse hydrogen atoms included in the insulating interlayer 7 into the semiconductor thin film 5. The passivating film (cap film) 8 is not always necessary, and the insulating interlayer 7 without a passivating film may be annealed. After a contact hole is provided, molybdenum, aluminum or the like is sputtered and patterned to a wiring electrode 9 with a given pattern. A planarization layer 10 composed of an acrylic resin is formed and a contact hole is provided. A transparent conductive film composed of ITO or the like is formed on the planarization layer 10 by sputtering, and is patterned to a pixel electrode 11 with a given pattern.

Figure 7:
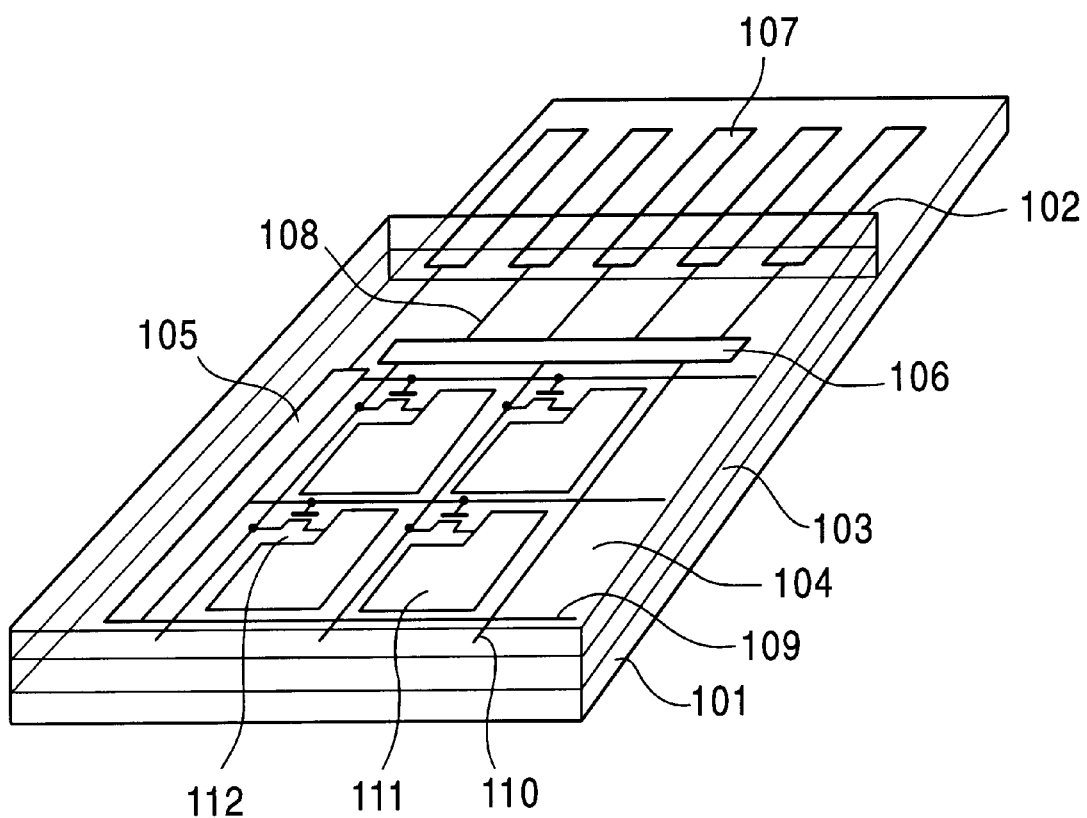
FIG. 7 is an isometric view of an embodiment of an active matrix display device using a thin film transistor as a switching element made according to the present invention.

An embodiment of an active matrix display device using the thin film transistor made by the method in accordance with the present invention will now be described with reference to FIG. 7. As shown in the drawing, the display device has a panel configuration including a pair of insulating substrates 101 and 102 and an electrooptic material 103 held therebetween. A liquid crystal material has been widely used as the electrooptic material 103. A pixel array section 104 and a driver circuit section are integrally formed on the bottom insulating substrate 101. The driver circuit section includes a vertical driver circuit 105 and a horizontal driver circuit 106. A terminal section 107 for external connection is formed at the upper end of the insulating substrate 101. The terminal section 107 is connected to the vertical driver circuit 105 and the horizontal driver circuit 106 through leads 108. Gate lines 109 in the line direction and signal leads 110 in the row direction are formed at the pixel array section 104. A pixel electrode 111 and a thin film transistor 112 are formed near the crossing point of the two leads. The gate electrode of the thin film transistor 112 is connected to the corresponding gate line 109, the drain electrode is connected to the corresponding pixel electrode 111, and the source region is connected to the corresponding signal lead 110. The gate line 109 is connected to the vertical driver circuit 105, and the signal lead 110 is connected to the horizontal driver circuit 106. A thin film transistor 112 for switching the pixel electrode 111 and thin film transistors included in the vertical driver circuit 105 and the horizontal driver circuit 106 are of a bottom-gate-type made by the method in accordance with the present invention.

As described above, in crystallization of the semiconductor thin film by laser irradiation in accordance with the present invention, the growth of the crystal grains in the section of the semiconductor thin film lying just above the gate electrode is more significant than that of the crystal grains in the section of the semiconductor thin film lying other than just above the gate electrode. Conditions of laser annealing for crystallization are determined in consideration of only the section on the gate electrode with a large allowance for the energy of laser light. Since the crystals in the channel region of the semiconductor thin film have a large grain size, a high performance thin film transistor with high mobility can be achieved. In particular, the use of thin film transistors as switching elements in an active matrix display device causes a significant improvement in uniformity of the image quality.

What is claimed is:

1. A method for making a thin film transistor comprising:
   forming a gate electrode on an insulating substrate;
   forming a gate insulating film on said gate electrode;
   depositing a semiconductor thin film on said gate insulating film;
   crystallizing said semiconductor thin film by laser light irradiation to cause more significant growth in the crystal grains in a first section of said semiconductor thin film lying just above said gate electrode than that of the crystal grains in a second section of said semiconductor thin film lying at a position other than just above said gate electrode; and
   selectively doping an impurity into said second section of the semiconductor thin film to form a source region and a drain region while leaving said first section of the semiconductor thin film as a channel-forming region.

2. A method for making a thin film transistor according to claim 1, wherein by laser light irradiation in said crystallization, said first section of the semiconductor thin film is changed into a polycrystalline state having a crystal grain size ranging from 100 nm to 500 nm while said second section of the semiconductor thin film is changed into a microcrystal or amorphous state having a crystal grain size of 10 nm or less.

3. A method for making a thin film transistor according to claim 1, wherein in said crystallization, said semiconductor thin film is irradiated with laser light having a wavelength of 400 nm or less and a pulse width of 10 ns or more.

4. A method for making a thin film transistor according to claim 3, wherein in said crystallization, said semiconductor thin film is irradiated with a laser light pulse with a rectangular irradiation area having a side of 1 cm or more so as to crystallize the area irradiated with said laser light pulse.

5. A method for making a thin film transistor according to claim 4, wherein in said crystallization, said semiconductor thin film is irradiated with laser light having an energy density ranging from 500 $mJ/cm^2$ to 700 $mJ/cm^2$.

6. A method for making a thin film transistor according to claim 1, wherein said method further comprises an impurity-activation step for activating said impurity doped into said source region and said drain region after said doping.

7. A method for making a thin film transistor according to claim 6, wherein said impurity-activation step is performed by reirradiating said semiconductor thin film with laser light under conditions not substantially affecting the crystalline state of said channel-forming region.

8. A method for making a thin film transistor according to claim 6, wherein said impurity-activation step is performed by rapid thermal annealing.

9. A method for making a thin film transistor according to claim 1, wherein in said depositing, said semiconductor thin film composed of amorphous silicon having a thickness of 50 nm or less is formed by a chemical vapor deposition process, and then heated so as to reduce the hydrogen content in said amorphous silicon to 5% or less.

10. A method for making a display device comprising the steps of integrally forming pixel electrodes and thin film transistors for driving the pixel electrodes on an insulating substrate, forming counter electrodes on another insulating substrate, and joining the two insulating substrates with a given space therebetween such that an electro-optical material is held in said space;
    each of said thin film transistors being formed by the following steps:
    forming a gate electrode on an insulating substrate;
    forming a gate insulating film on said gate electrode;
    depositing a semiconductor thin film on said gate insulating film;
    crystallizing said semiconductor thin film by laser light irradiation to cause more significant growth in the crystal grains in a first section of said semiconductor thin film lying just above said gate electrode than that of the crystal grains in a second section of said semiconductor thin film lying at a position other than just above said gate electrode; and
    selectively doping an impurity into said second section of the semiconductor thin film to form a source region and a drain region while leaving said first section of the semiconductor thin film as a channel-forming region.

11. A method for making a display device according to claim 10, wherein by laser light irradiation in said crystallization, said first section of the semiconductor thin film is changed into a polycrystalline state having a crystal grain size ranging from 100 nm to 500 nm while said second section of the semiconductor thin film is changed into a microcrystal or amorphous state having a crystal grain size of 10 nm or less.

12. A method for making a display device according to claim 10, wherein in said crystallization, said semiconductor thin film is irradiated with laser light having a wavelength of 400 nm or less and a pulse width of 10 ns or more.

13. A method for making a display device according to claim 10, wherein in said crystallization, said semiconductor thin film is irradiated with a laser light pulse with a rectangular irradiation area having a side of 1 cm or more so as to crystallize the area irradiated with said laser light pulse.

14. A method for making a display device according to claim 10, wherein in said crystallization, said semiconductor thin film is irradiated with laser light having an energy density ranging from 500 mJ/cm$^2$ to 700 mJ/cm$^2$.

15. A method for making a display device according to claim 10, wherein after said doping, said semiconductor thin film is reirradiated with laser light to activate and crystallize said source region and said drain region under conditions not substantially affecting the crystal state of said channel-forming region.

16. A method for making a display device according to claim 10, wherein in said depositing, said semiconductor thin film composed of amorphous silicon having a thickness of 50 nm or less is formed by a chemical vapor deposition process, and then heated so as to reduce the hydrogen content in said amorphous silicon to 5% or less.

* * * * *